US006874510B2

(12) United States Patent
Reder et al.

(10) Patent No.: US 6,874,510 B2
(45) Date of Patent: Apr. 5, 2005

(54) METHOD TO USE A LASER TO PERFORM THE EDGE CLEAN OPERATION ON A SEMICONDUCTOR WAFER

(75) Inventors: Steven Reder, Boring, OR (US); Michael Berman, West Linn, OR (US); Rennie Barber, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 7 days.

(21) Appl. No.: 10/360,903

(22) Filed: Feb. 7, 2003

(65) Prior Publication Data

US 2004/0154638 A1 Aug. 12, 2004

(51) Int. Cl.⁷ .................................................. C25F 5/00
(52) U.S. Cl. ....................... 134/1.3; 134/1; 134/33; 134/37; 216/63; 216/65; 219/121.6
(58) Field of Search .......................... 134/1, 1.3, 33, 134/37; 216/63, 65, 66; 219/121.6

(56) References Cited

U.S. PATENT DOCUMENTS 5,669,979 A * 9/1997 Elliott et al. ................... 134/1
5,814,156 A * 9/1998 Elliott et al. ................... 134/1
6,376,797 B1 * 4/2002 Piwczyk et al. ........ 219/121.72
6,423,928 B1 * 7/2002 Piwczyk ................. 219/121.67
6,454,877 B1 * 9/2002 Kumar et al. ................ 148/222
6,683,277 B1 * 1/2004 Millard et al. .......... 219/121.84
6,701,942 B2 * 3/2004 Lee et al. ....................... 134/61

FOREIGN PATENT DOCUMENTS

JP          6-335790      *   6/1994
JP          2000-348396   *  12/2000

* cited by examiner

Primary Examiner—M. Kornakov
(74) Attorney, Agent, or Firm—Trexler, Bushnell, Giangiorgi & Blackstone, Ltd.

(57) ABSTRACT

A method for performing the edge clean operation on a semiconductor wafer. A laser beam is used to accurately clean the edge of the wafer. The wafer is clamped concentrically to a chuck and rotated at a selectable speed, preferably in the range of 10 rpm to 1,000 rpm. A laser beam of variable power is directed onto toward the edge of the wafer at an oblique angle through a nozzle through which an inert purge gas is simultaneously passed. The laser beam removes unwanted deposits at the edge of the wafer and the gas is used to blow away the residue and prevent slag buildup on other parts of the wafer. The process is preferably carried out in an exhausted chamber.

13 Claims, 2 Drawing Sheets

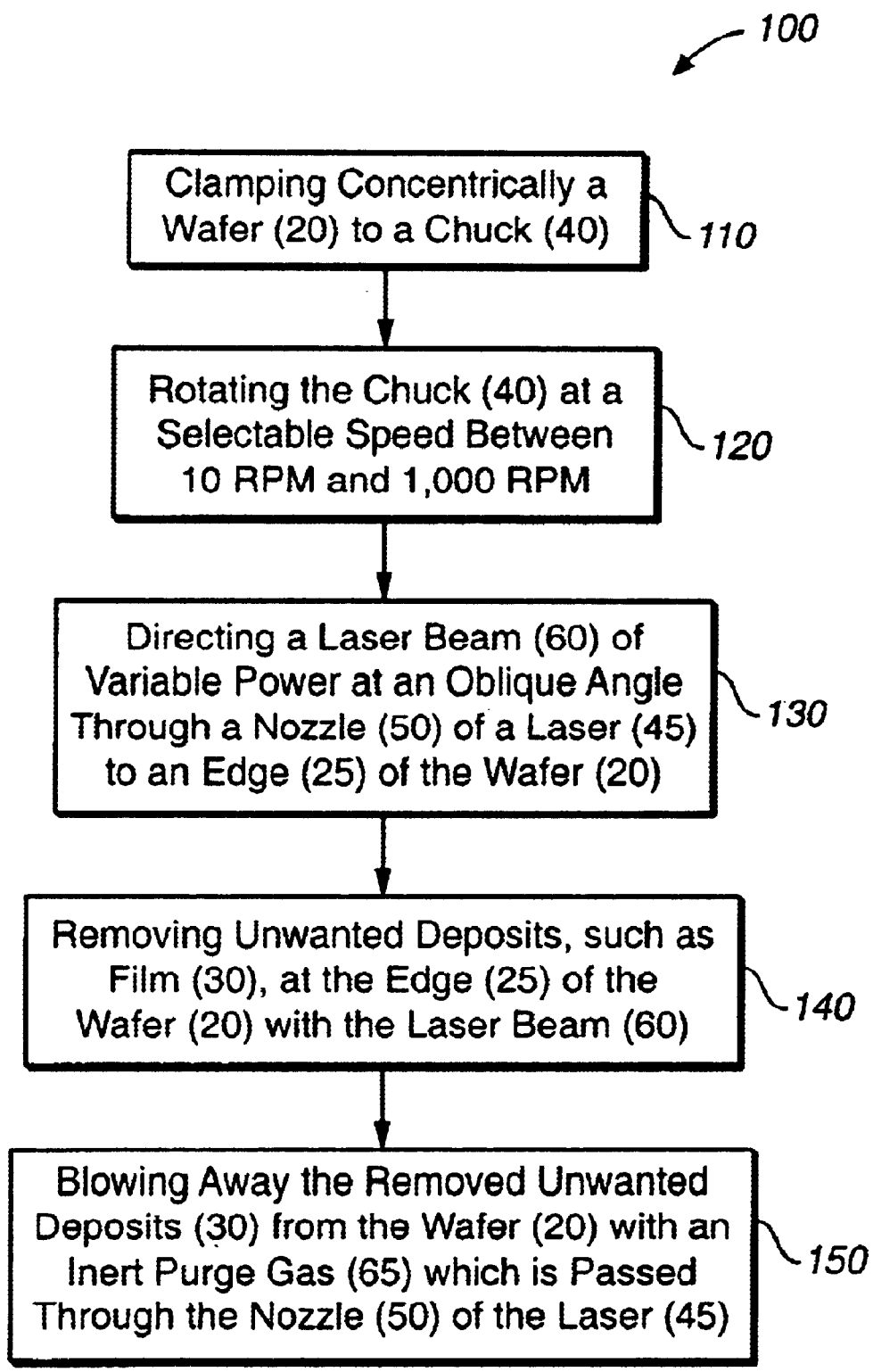
FIG._1

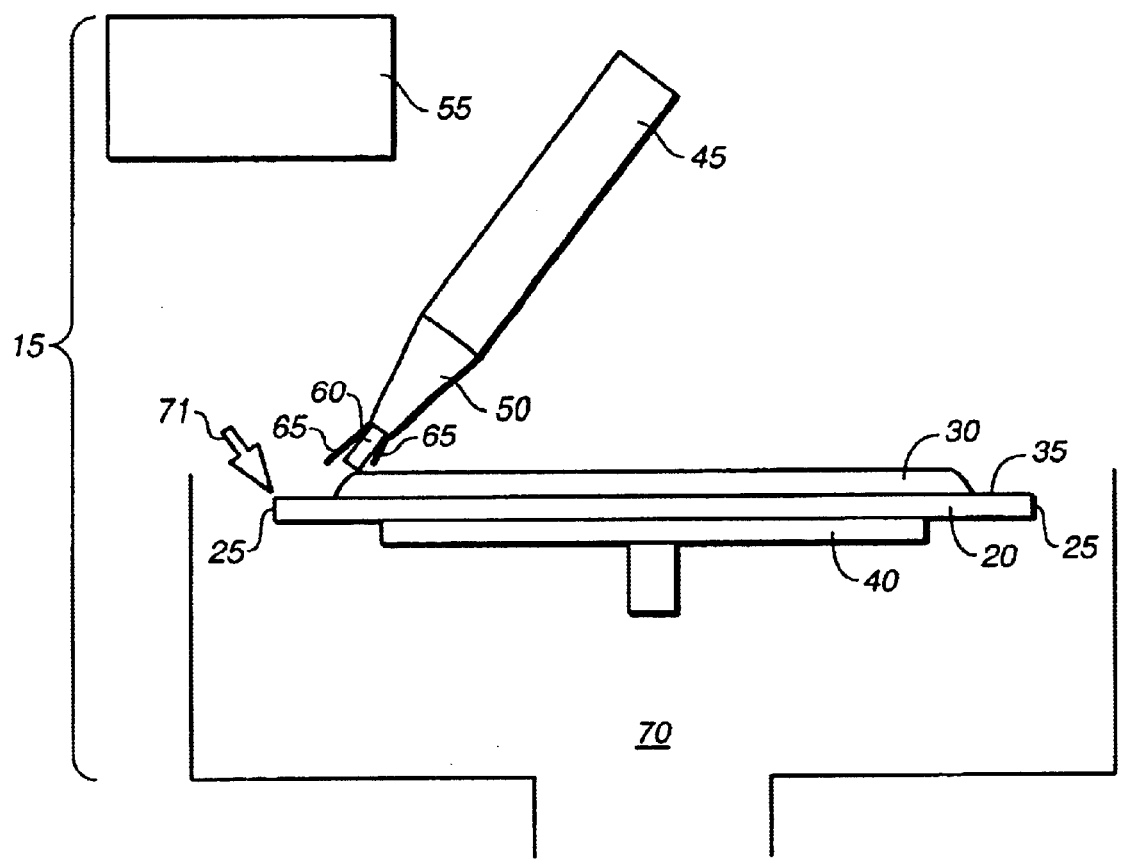
FIG._2

METHOD TO USE A LASER TO PERFORM THE EDGE CLEAN OPERATION ON A SEMICONDUCTOR WAFER

BACKGROUND OF THE INVENTION

The present invention relates to a method of performing the edge clean operation on semiconductor wafers. More specifically, the present invention relates to a method of using a laser to perform the edge clean operation on semiconductor wafers.

One of the major problems gaining attention in wafer processing today is the edge related defects. Edge related defects contribute to lower die yield and lost revenue. A typical type of edge defect is the peeling of edge films due to poor adhesion to underlying layers.

Many processing schemes have been devised and implemented to reduce edge related defects. The majority of processing schemes involve costly photo masking and etching steps in an attempt to reduce or eliminate the defects. The wafer is coated with photo resist and run through an edge bead removal step. The wafer is then etched in a plasma etcher to remove the films on the edge of the wafer. The resist is then stripped off in both a dry and then wet process. The wafer is then sent on for subsequent processing.

The disadvantage associated with these existing solutions is that the wafers have to run through additional processing steps that can add both high cost and long cycle times.

Therefore, an improved method for performing the edge clean operation on a semiconductor wafer is needed. The present invention provides such a method for performing the edge clean operation on a semiconductor wafer. Features and advantages of the present invention will become apparent upon a reading of the attached specification, in combination with a study of the drawings.

OBJECTS AND SUMMARY OF THE INVENTION

A primary object of an embodiment of the invention is to provide a method of using a laser to perform the edge clean operation on a semiconductor wafer.

An object of an embodiment of the invention is to provide a significant reduction in process steps necessary to accomplish the edge cleaning process on a semiconductor wafer.

An object of an embodiment of the invention is to provide for the elimination of the need for a very expensive resist coating track, photolithe stepper, plasma etcher, resist asher and solvent resist strip such that a significant reduction in capital equipment costs and a decrease in wafer cycle time are achieved.

Another object of an embodiment of the invention is to provide the capability to control the laser power and incidence angle to enable selective cleaning down to any desired layer by adjusting laser power.

Another object of an embodiment of the invention is to provide semiconductor wafers having their edges cleaned by the method of using a laser with a clean boundary between the clean and non-cleaned areas.

Briefly, and in accordance with at least one of the foregoing, an embodiment of the present invention provides a method for performing the edge clean operation on a semiconductor wafer. Specifically, a laser beam is used to accurately clean the edge of the wafer. The wafer is clamped concentrically to a chuck and rotated at a selectable speed, such as in the range of 10 rpm to 1,000 rpm. A laser beam of variable power is directed onto the edge of the wafer at an oblique angle through a nozzle through which an inert purge gas is simultaneously passed. The laser beam removes unwanted deposits at the edge of the wafer and the gas is used to blow away the residue and prevent slag buildup on other parts of the wafer. The process is carried out in an exhausted chamber. Preferably, there is accurate wafer concentricity and laser alignment to the wafer edge. Preferably, an accurate form of wafer to chuck alignment system is used. This can be insured by use of a co-axial closed-loop video monitoring system that monitors both the edge of the wafer and the point of contact by the laser.

BRIEF DESCRIPTION OF THE DRAWINGS

The features of the present invention which are believed to be novel, are described in detail herein below. The organization and manner of the structure and operation of the invention, together with further objects and advantages thereof, may best be understood by reference to the following description taken in connection with the accompanying drawings wherein like reference numerals identify like elements in which:

FIG. 1 is a flow chart illustrating a method of performing an edge clean process of a semiconductor wafer in accordance with an embodiment of the present invention; and FIG. 2 is a side-elevational view of the system used for performing the method illustrated in FIG. 1.

DETAILED DESCRIPTION OF THE ILLUSTRATED EMBODIMENT

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

The present invention provides a method 100 of performing an edge clean operation on a semiconductor wafer 20, which is illustrated in FIG. 1. The system 15 used for performing the method 100 is illustrated in FIG. 2.

As illustrated in FIG. 2, the system 15 used for performing the method 100 includes the wafer 20 having an edge 25. Film 30 is attached to a top surface 35 of the wafer 20. The system 15 further includes a chuck 40, a laser 45 having a nozzle 50, and a video monitoring system 55. The laser 45 is capable of emitting a laser beam 60 through the nozzle 50. An inert purge gas 65 is also emitted through the nozzle 50 of the laser 45. The video monitoring system 55 is preferably a co-axial closed-loop video monitoring system. The laser 45 is configured to emit laser beams 60 of variable power. The system is provided within an exhausted chamber 70, although the video monitoring system 55 does not necessarily have to be provided within the exhausted chamber 70.

The method 100 of the present invention will now be discussed with reference to FIG. 1. The first step 110 of the method 100 is to clamp the wafer 20 to the chuck 40 such that the top surface 35, and thus the film 30 on the top surface 35 of the wafer 20, are not positioned on the chuck 40. The wafer 20 is preferably clamped concentrically to the chuck 40.

The second step 120 of the method 100 is to rotate the chuck 40, with the wafer 20 clamped thereto, at a selectable speed. The selectable speed of the rotation of the chuck 40, with the wafer 20 clamped thereto, is preferably between ten revolutions per minute (10 rpm) and one-thousand revolutions per minute (1,000 rpm).

The third step 130 of the method 100 is to direct the laser beam 60 at an oblique angle through the nozzle 50 of the laser 45 to the edge 25 of the wafer 20.

The fourth step 140 of the method 100 is to remove unwanted deposits, such as the film 30 on the top surface 35 of the wafer 20, at the edge 25 of the wafer 20 with the laser beam 60 Thus, as illustrated in FIG. 2, the top surface 35 of the wafer 20 proximate to the edge 25 thereof is clean of unwanted deposits, such as the film 30.

The fifth step 150 of the method 100 is to blow away the removed unwanted deposits 30 from the wafer 20 with an inert purge gas 65 which is passed through the nozzle 50 of the laser 45. The inert purge gas 65 is preferably passed through the nozzle 50 of the laser 45 at the same time the laser beam 60 is removing unwanted deposits 30 from the top surface 35 of the wafer 20 in the fourth step 140. Because the inert purge gas 65 blows away the removed unwanted deposits 30 from the wafer 20, slag build up on other parts of the wafer 20 is prevented.

The method 100 is preferably performed in the exhausted chamber 70. Preferably, there is accurate concentricity of the wafer 20 and alignment of the laser 45 with the edge 25 of the wafer 20. Preferably, an accurate form of wafer 20 to chuck 40 alignment system is used. This can be insured by the use of the co-axial closed loop video monitoring system 55 that monitors both the edge 25 of the wafer 20 and the point of contact by the laser beam 60.

It should be understood that the sequence of steps 110, 120, 130, 140, 150 described in the method 100 is only the preferred sequence of operation of the steps 110, 120, 130, 140, 150, such that certain steps 110, 120, 130, 140, 150 could be performed prior to other steps 110, 120, 130, 140, 150 or could be done simultaneously with other steps 110, 120, 130, 140, 150. For instance, the third step 130 could be performed prior to, or simultaneously with the second step 120. Likewise, the fourth and fifth steps 140, 150 could be performed simultaneously.

The system 15 and method 100 provide a number of advantages in cleaning the edge 25 of a wafer 20 in comparison to those of the prior art. The system 15 and method 100 provide a significant reduction in process steps necessary to accomplish the edge cleaning process. The system 15 and the method 100 eliminate the need for a very expensive resist coating track, photolithe stepper, resist asher, and solvent resist strip, such that a significant reduction in capital equipment costs and a decrease in wafer cycle time are achieved. An additional advantage of the system 15 and the method 100 is the capability to control the power of the laser 45 and the incidence angle to enable selective cleaning down to an desired layer by adjusting the power of the laser 45. Further, the edge clean accomplished by this method leaves a clean boundary between clean and non-cleaned area.

While a preferred embodiment of the present invention is shown and described, it is envisioned that those skilled in the art may devise various modifications of the present invention without departing from the spirit and scope of the appended claims.

The invention is claimed as follows:

1. A method of performing an edge clean operation on a wafer, the method comprising the steps of:

directing a laser beam through a nozzle to a peripheral edge of a top surface of the wafer at an oblique angle relative to the top surface;

removing unwanted deposits at the edge of the wafer with the laser beam; and blowing away the removed unwanted deposits from the wafer by passing an inert purge gas simultaneously with the laser beam through the nozzle.

2. A method as defined in claim 1, further including the steps of:

clamping the wafer to a chuck; and rotating the chuck at a selectable speed prior to direction the laser beam to the edge of the wafer.

3. A method as defined in claim 2, further comprising clamping the wafer concentrically to the chuck.

4. A method as defined in claim 2, further comprising rotating the chuck at between ten revolutions per minute and one-thousand revolutions per minute.

5. A method as defined in claim 2, further comprising performing the steps in an exhausted chamber.

6. A method as defined in claim 2, further comprising video monitoring both the edge of the wafer and the point of its contact by the laser beam.

7. A method as defined in claim 6, wherein the video monitoring is performed by a co-axial closed-loop video monitoring system.

8. A method as defined in claim 1, wherein a laser beam of variable power.

9. A method as defined in claim 1, further comprising directing the laser beam to the edge of the wafer through a nozzle of a laser.

10. A method as defined in claim 1, further comprising performing the steps of the method in an exhausted chamber.

11. A method as defined in claim 1, further comprising video monitoring both the edge of the wafer and the point of its contact by the laser beam.

12. A method as defined in claim 11, wherein the video monitoring is performed by a co-axial closed-loop video monitoring system.

13. A method as defined in claim 1, wherein the unwanted deposits are films at the edge of the wafer.

* * * * *